United States Patent
Smith

(10) Patent No.: US 10,382,862 B2
(45) Date of Patent: Aug. 13, 2019

(54) NOISE TESTING IN AN AUTONOMOUS VEHICLE

(71) Applicant: Uber Technologies, Inc., San Francisco, CA (US)

(72) Inventor: Paul Kevin Smith, Wexford, PA (US)

(73) Assignee: Uber Technologies, Inc., San Francisco, CA (US)

( * ) Notice: Subject to any disclaimer, the term of this patent is extended or adjusted under 35 U.S.C. 154(b) by 0 days.

(21) Appl. No.: 15/933,730

(22) Filed: Mar. 23, 2018

(65) Prior Publication Data
US 2018/0367895 A1     Dec. 20, 2018

Related U.S. Application Data

(60) Provisional application No. 62/519,924, filed on Jun. 15, 2017.

(51) Int. Cl.
| | |
|---|---|
| *H04R 3/00* | (2006.01) |
| *B60W 40/02* | (2006.01) |
| *B60W 50/00* | (2006.01) |
| *H03G 3/32* | (2006.01) |

(52) U.S. Cl.
CPC ............. *H04R 3/005* (2013.01); *B60W 40/02* (2013.01); *B60W 50/0098* (2013.01); *H03G 3/32* (2013.01); *H04R 2499/13* (2013.01)

(58) Field of Classification Search
CPC ... H04R 3/005; H04R 2499/13; B60W 40/02; B60W 50/0098; H03G 3/32
See application file for complete search history.

(56) References Cited

U.S. PATENT DOCUMENTS

2017/0358151 A1* 12/2017 Koons ................. G07C 5/0808
2018/0315413 A1* 11/2018 Lee .......................... H04R 3/04

* cited by examiner

*Primary Examiner* — Andrew L Sniezek
(74) *Attorney, Agent, or Firm* — Dority & Manning, P.A.

(57) ABSTRACT

The present disclosure provides systems and methods for determining a noise level associated with an autonomous vehicle. The autonomous vehicle can include a passenger compartment configured to house one or more passengers. A method can include positioning one or more microphones at one or more locations in the passenger compartment, collecting first data indicative of a first sound level by the one or more microphones with the autonomous vehicle operating at a first operating condition, implementing an operating condition change for the autonomous vehicle from the first operating condition to a second operating condition, collecting second data indicative of a second sound level by the one or more microphones, and determining a noise level associated with the autonomous vehicle based at least in part on the first data and the second data.

22 Claims, 7 Drawing Sheets

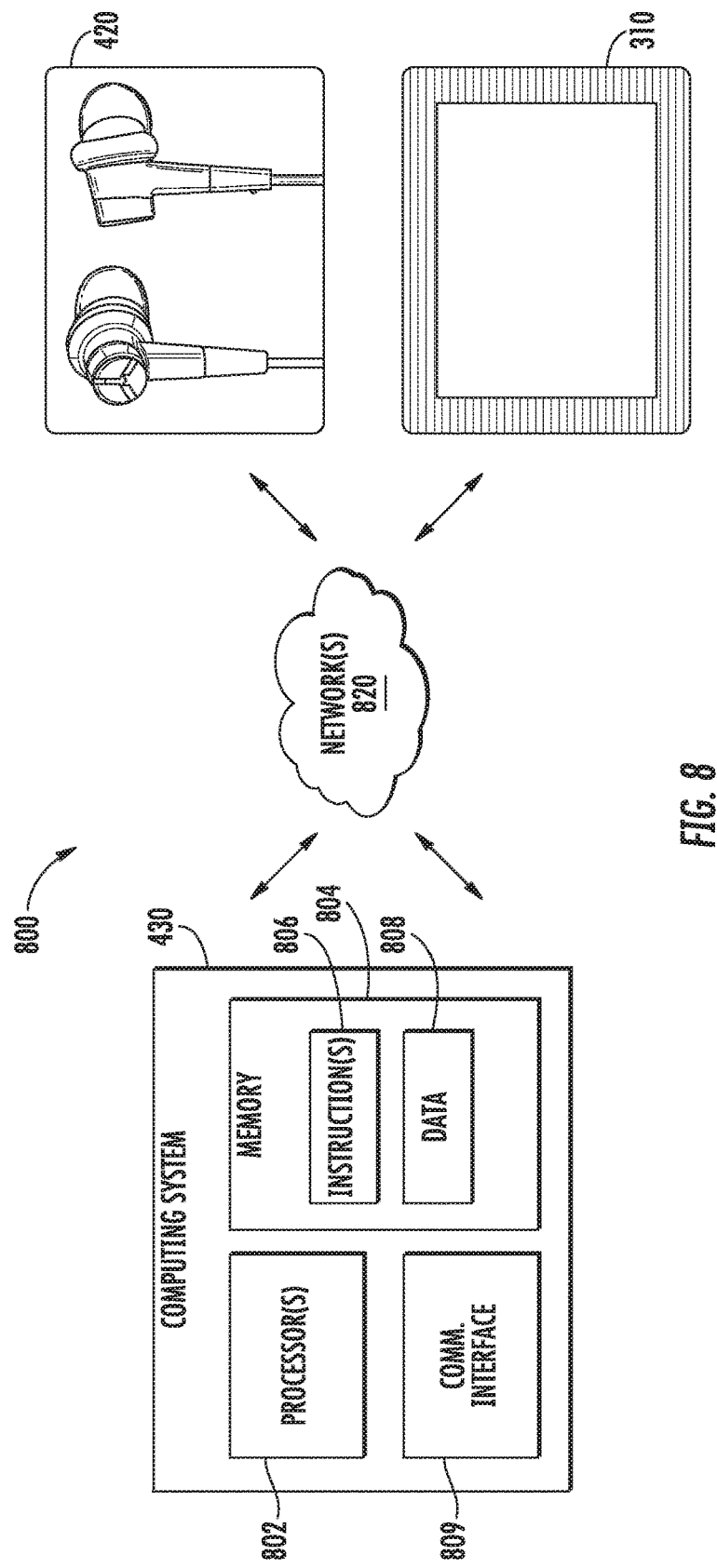

NOISE TESTING IN AN AUTONOMOUS VEHICLE

PRIORITY CLAIM

The present application is based on and claims benefit of U.S. Provisional Application 62/519,924 having a filing date of Jun. 15, 2017, which is incorporated by reference herein.

FIELD

The present disclosure relates generally to systems and methods for determining noise levels. More particularly, the present disclosure relates to systems and methods for determining a noise level associated with an autonomous vehicle.

BACKGROUND

An autonomous vehicle is a vehicle that is capable of sensing its environment and navigating with little to no human input. In particular, an autonomous vehicle can observe its surrounding environment using a variety of sensors and can attempt to comprehend the environment by performing various processing techniques on data collected by the sensors. Given knowledge of its surrounding environment, the autonomous vehicle can identify an appropriate motion path through such surrounding environment with little to no input from a passenger in the autonomous vehicle.

One advantage provided by an autonomous vehicle is that a passenger is not restricted to any particular passenger location in the vehicle. For example, in an ordinary vehicle, an operator must be positioned at a passenger location that enables the operator to operate the vehicle, such as a driver's seat in an automobile. However, in an autonomous vehicle, a passenger can sit in any passenger location in the passenger compartment, such as a passenger location in a rear seat.

Conventionally, testing for noise levels in a vehicle has been limited to testing for noise levels at a single location, typically at an operator's location, such as a driver's seat. Such conventional testing, however, does not account for variations in noise levels at other passenger locations in the vehicle, such as passenger locations in the rear of the vehicle. Furthermore, conventional noise testing has typically been limited to testing for road, engine, and operational noises, such as tonal sounds from an engine operating or transient sounds from a component rattling. Further, conventional noise testing methods typically do not account for other sources of noise in a vehicle, such as when one or more passengers communicate with each other or when a passenger communicates with a voice-based user interface to provide a command to a system associated with autonomous operation of the autonomous vehicle. Thus, there exists a need for improved systems and methods for noise testing in autonomous vehicles to improve the quality of passenger experiences at all passenger locations in the autonomous vehicle and to enhance operation of autonomous systems in the autonomous vehicle.

SUMMARY

Aspects and advantages of embodiments of the present disclosure will be set forth in part in the following description, or can be learned from the description, or can be learned through practice of the embodiments.

One example aspect of the present disclosure is directed to a method for determining a noise level associated with an autonomous vehicle. The autonomous vehicle can include a passenger compartment configured to house one or more passengers. The method can include positioning one or more microphones at one or more locations in the passenger compartment. The method can further include collecting first data indicative of a first sound level by the one or more microphones with the autonomous vehicle operating at a first operating condition. The method can further include implementing an operating condition change for the autonomous vehicle from the first operating condition to a second operating condition. While the autonomous vehicle is operated at the second operating condition, the method can further include, collecting second data indicative of a second sound level by the one or more microphones. The method can further include determining a noise level associated with the autonomous vehicle based at least in part on the first data and the second data.

Another example aspect of the present disclosure is directed to one or more non-transitory computer-readable media that collectively store instructions that, when executed by one or more processors, cause a computing system to perform operations. While an autonomous vehicle is operated at a first operating condition, the operations can include, receiving, by the one or more processors, first data indicative of a first sound level from one or more microphones positioned at one or more locations in a passenger compartment of the autonomous vehicle. Following an operating condition change from the first operating condition to a second operating condition, the operations can further include, receiving, by the one or more processors, second data indicative of a second sound level from the one or more microphones with the autonomous vehicle operating at the second operating condition; wherein the second operating condition is a different operating condition from the first operating condition. The operations can further include determining, by the one or more processors, a noise level associated with the autonomous vehicle based at least in part on the first data and the second data.

Another example aspect of the present disclosure is directed to a testing system for determining a noise level associated with an autonomous vehicle. The autonomous vehicle can include a passenger compartment configured to house one or more passengers. The testing system can include one or more microphones positioned at one or more locations in the passenger compartment and a computing system comprising one or more processors and one or more tangible, non-transitory computer readable media that collectively store instructions that when executed by the one or more processors cause the computing system to perform operations. The operations can include receiving first data indicative of a first sound level from the one or more microphones with the autonomous vehicle operating at a first operating condition. The operations can further include receiving second data indicative of a second sound level from the one or more microphones with the autonomous vehicle operating at a second operating condition. The operations can further include determining a noise level associated with the autonomous vehicle based at least in part on the first data and the second data. The second operating condition can be different from the first operating condition.

Other aspects of the present disclosure are directed to various systems, apparatuses, non-transitory computer-readable media, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which:

FIG. 8 depicts example computing system components according to example aspects of the present disclosure.

DETAILED DESCRIPTION

Figure 1:
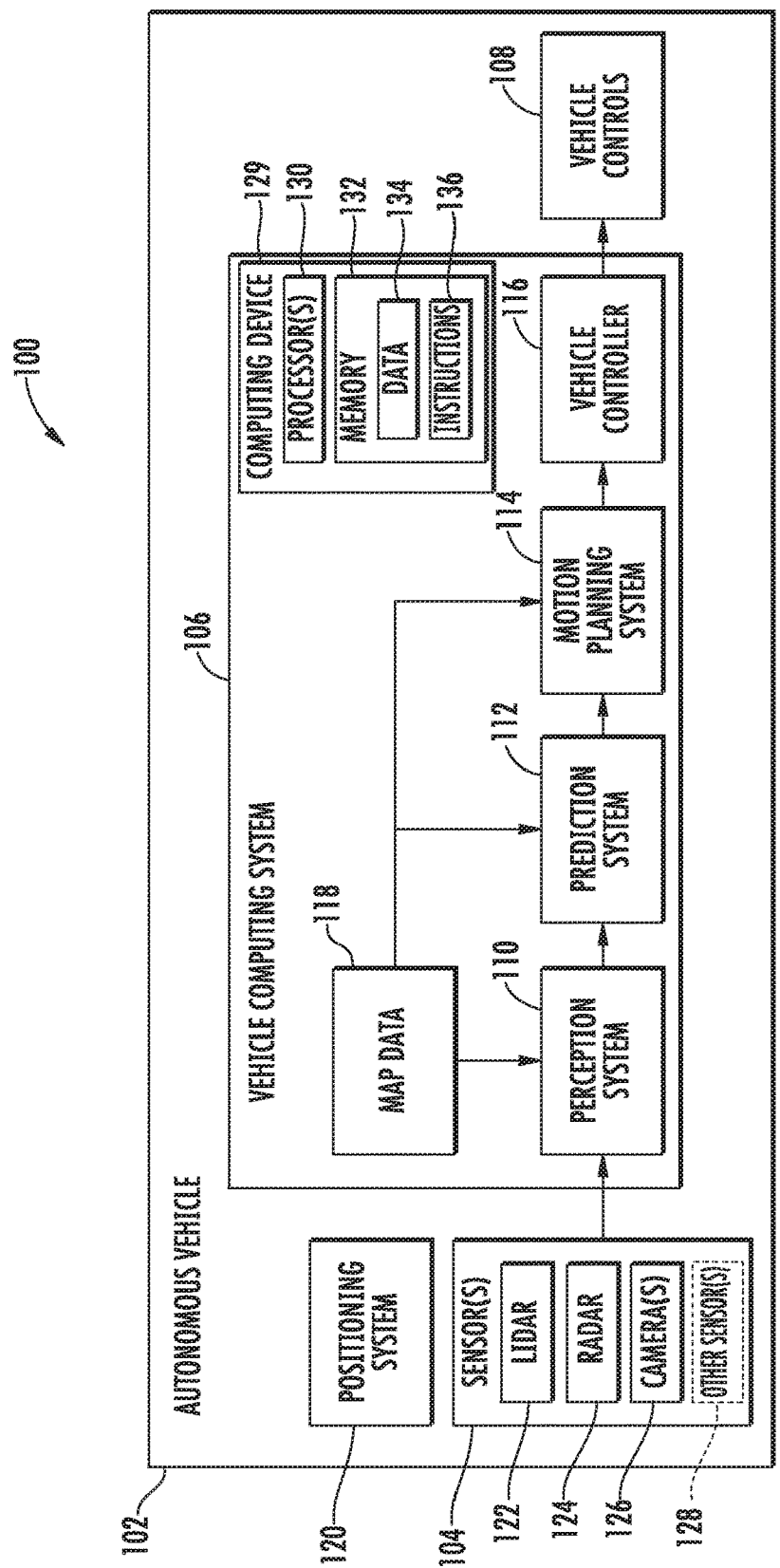
FIG. 1 depicts an example autonomous vehicle according to example aspects of the present disclosure.

Example aspects of the present disclosure are directed to determining a noise level associated with an autonomous vehicle. For example, an autonomous vehicle can drive, navigate, operate, etc. with an autonomous mode. Various components, such as components associated with autonomous navigation, obstacle detection, user interaction, etc. can be incorporated into an autonomous vehicle to achieve autonomous operation of the autonomous vehicle. Adding these components, however, can introduce additional noise during operation of the autonomous vehicle. For instance, the components themselves can introduce noise when they are operated or by responding to operating conditions, such as when the components are vibrated in response to road conditions.

According to example aspects of the present disclosure, one or more microphones can be positioned within a passenger compartment of an autonomous vehicle. First data indicative of a first sound level can be collected by the one or more microphones while the autonomous vehicle is operated at a first operating condition. For example, the first data can be collected while the autonomous vehicle is driven on a highway without a component associated with autonomous vehicle operation installed in the autonomous vehicle. An operating condition change can be implemented for the autonomous vehicle in order to operate the autonomous vehicle at a second operating condition. For example, the autonomous vehicle can be driven on the highway with the component associated with autonomous vehicle operation installed in the autonomous vehicle. While the autonomous vehicle is operated at the second operating condition, second data indicative of a second sound level can be collected by the one or more microphones. By using the first data and the second data, a noise level associated with the autonomous vehicle can be determined. For example, by comparing the first sound level to the second sound level, the additional sound attributable to the installed component associated with autonomous operation can be determined.

In some embodiments, a respective noise level can be determined for each of a plurality of components used for autonomous operation, and using the noise level for each of the components, a component can be selected for inclusion in an autonomous vehicle. For example, if a noise level associated with a component used for autonomous operation exceeds a threshold, a design modification can be made to reduce the noise level associated with the component or a different component that does not exceed the threshold can be selected for inclusion in the autonomous vehicle.

More particularly, an autonomous vehicle (e.g., a ground-based vehicle, air-based vehicle, other vehicle type) can include a vehicle computing system that implements a variety of systems on-board the autonomous vehicle. For instance, the vehicle computing system can include one or more data acquisition systems (e.g., image capture devices, LIDAR system, RADAR system), an autonomy computing system (e.g., for determining autonomous navigation), one or more vehicle control systems (e.g., for controlling braking, steering, powertrain), one or more vehicle component sensors (e.g., associated with a various vehicle components), a human-machine interface, etc. One or more of these systems can enable the autonomous vehicle to operate in a fully autonomous (e.g., self-driving) manner in which the autonomous vehicle can drive and navigate with minimal and/or no interaction from a human operator present in the autonomous vehicle. For example, the autonomous vehicle can operate in an autonomous navigation mode to transport one or more passengers to a destination location (e.g., while providing rideshare services).

The autonomous vehicle can include one or more passenger locations. As used herein, the term "passenger location" refers to a location in a passenger compartment of an autonomous vehicle configured to accommodate a passenger during operation of the autonomous vehicle. For example, a passenger location can be a seat, such as a bench seat or bucket seat located in the passenger compartment. In various implementations, an autonomous vehicle can include a plurality of passenger locations. For example, in some implementations, an autonomous vehicle can include four passenger locations, such as two passenger locations in the front of a passenger compartment, and two passenger locations in the rear of a passenger compartment. In some implementations, the passenger compartment of an autonomous vehicle can include any number of passenger locations. The autonomous vehicle can further include one or more computing devices, such as one or more tablet computers, which can be accessible from a passenger location. For example, a first computing device can be positioned between two passenger locations in the front of an autonomous vehicle, and a second computing device can be positioned between two passenger locations in the rear of the autonomous vehicle. One or more passengers traveling in the autonomous vehicle can interact with the computing devices in order to perform various functions, such as inputting a travel destination.

A testing system for determining a noise level associated with an autonomous vehicle can include one or more microphones. The one or more microphones can be positioned at one or more locations in the passenger compartment, such as at one or more passenger locations or computing device locations accessible from a passenger location. In some implementations, the one or more microphones can include one or more pairs of binaural microphones positioned on a passenger or passenger analogue occupying one of the passenger locations. In some implementations, the one or more microphones can be associated with one or more computing devices accessible from one or more passenger locations, such as one or more microphones integrated into the computing devices. In some implementations, the one or more microphones can be positioned at a passenger location in the rear of the passenger compartment, such as a passenger location in the backseat of the autonomous vehicle.

The testing system can include a computing system configured to receive data from the one or more microphones. For example, the one or more microphones positioned in the passenger compartment can record sound levels during various operating conditions, and can provide data indicative of the recorded sound levels to the computing system.

The one or more microphones can record a first sound level in the autonomous vehicle at a first operating condition. The first operating condition can be, for example, while the autonomous vehicle is powered off, while the autonomous vehicle is at rest, while the autonomous vehicle is operated at a first speed, while the autonomous vehicle is operated on a first type of road, while the autonomous vehicle is operated in a first weather condition, while a component associated with autonomous vehicle operation is not installed in the autonomous vehicle, while a component associated with autonomous operation is unpowered, while a passenger is not talking, or other operating condition. The one or more microphones can collect first data indicative of the sound level at the first operating condition, and can provide the first data to the computing system.

The one or more microphones can further record a second sound level in the autonomous vehicle at a second operating condition. For example, the second operating condition can be while the autonomous vehicle is turned on, while the autonomous vehicle is moving, while the autonomous vehicle is operated at a second speed, while the autonomous vehicle is operated on a second type of road, while the autonomous vehicle is operated in a second weather condition, while the component associated with autonomous operation is installed in the autonomous vehicle, while the component associated with autonomous operation is powered on, while a passenger is talking, while a passenger is talking at a different volume level, or other operating condition. Second data indicative of the second sound level at the second operating condition can similarly be provided to the computing system by the one or more microphones. In some implementations, a plurality of microphones positioned at a plurality of locations in the passenger compartment can together provide the first data and the second data.

The computing system can determine a noise level associated with the autonomous vehicle based at least in part on the first data and the second data. For example, a processor in the computing system can be configured to analyze the first data and the second data in order to determine a noise level associated with the autonomous vehicle, such as by comparing the sound levels of the first data and the second data at one or more operating conditions. Various processing techniques can be applied to the first data and second data to analyze noise levels associated with the autonomous vehicle.

In some embodiments, a respective noise level for a plurality of components can be determined, and an individual component can be selected from the plurality of components for inclusion in the autonomous vehicle based at least in part on the respective noise level for each component. For example, a manufacturer or an operator of an autonomous vehicle may desire to limit the incremental noise introduced by added components in an autonomous vehicle in order to improve a passenger experience while riding in the autonomous vehicle. For example, the manufacturer/operator may be considering two different mounting brackets to use for mounting a LIDAR system to the autonomous vehicle. The manufacturer/operator can determine a noise level for each mounting bracket while the autonomous vehicle is operated in a variety of operating conditions. The manufacturer/operator can then make a determination as to which mounting bracket to include in the autonomous vehicle based on the respective noise levels of the two mounting brackets. For example, the manufacturer/operator can choose the mounting bracket that has a lower noise level or a noise level below a threshold noise level.

Additionally, an ambient noise level of the autonomous vehicle can be determined. For example, an autonomous vehicle can be operated in a plurality of ambient operating conditions, wherein for each ambient operating condition in the plurality, a component, such as a component associated with autonomous operation, is either not installed in the autonomous vehicle or the component associated with autonomous operation is not powered on. Data indicative of ambient sound levels for each of the plurality of ambient operating conditions can be collected, such as by recording respective ambient sound levels with one or more microphones positioned in the autonomous vehicle for each ambient operating condition in the plurality. Based on the respective data indicative of an ambient sound level for the plurality of ambient operating conditions, an ambient noise level can be determined. The ambient noise level can be, for example, a threshold noise level for any components added to the autonomous vehicle. For example, the manufacturer/operator can choose a mounting bracket that has a noise level that does not exceed the ambient noise level. Further, the ambient noise level can be used in order to develop specifications for acceptable noise levels for components added to the autonomous vehicle, such as design specifications provided to component manufacturers.

The system and methods described herein may provide a number of technical effects and benefits. For instance, an ambient noise level for an autonomous vehicle can be determined in a variety of operating conditions. The ambient noise level can be used to select components to be added to an autonomous vehicle in order to improve a user's experience, such as by limiting a user's exposure to excessive noise levels. The ambient noise level can further be used to establish design criteria for component manufacturers. Further, the systems and methods described herein can allow for determining noise levels for passengers throughout a passenger compartment, including passengers in both the front and rear of a passenger compartment. This can help to ensure that all passengers travelling in an autonomous vehicle have a quality user experience.

Additionally, determining noise levels at various locations within a passenger compartment can enable the improved design of an autonomous vehicle. For example, microphones associated with user interaction with the autonomous vehicle can be placed in locations which have been determined to provide improved voice command recognition. Further, example aspects of the present disclosure can provide for more efficient processing of sound data to determine noise levels associated with autonomous vehicles. For example, first data indicative of a first sound level with an autonomous vehicle operating at a first operating condition and second data indicative of a second sound level with the autonomous vehicle operating at a second operating condition different from the first operating condition can be provided to a processor, and a noise level associated with the autonomous vehicle can be determined by the processor based at least in part on the first data and the second data. In this way, the systems and methods according to the present disclosure can allow for determining a noise level associated with an autonomous vehicle, thereby enabling for improved design decisions and improved passenger experiences.

With reference to the figures, example aspects of the present disclosure will be discussed in further detail. FIG. 1 depicts a block diagram 100 of an example system for controlling the navigation of an autonomous vehicle 102 according to example aspects of the present disclosure. The autonomous vehicle 102 is capable of sensing its environment and navigating without human input. The autonomous vehicle 102 can be a ground-based autonomous vehicle (e.g., car, truck, bus, etc.), an air-based autonomous vehicle (e.g., airplane, drone, helicopter, or other aircraft), or other types of vehicles (e.g., watercraft). The autonomous vehicle 102 can be configured to operate in one or more modes, for example, a fully autonomous operational mode and/or a semi-autonomous operational mode. A fully autonomous (e.g., self-driving) operational mode can be one in which the autonomous vehicle can provide driving and navigational operation with minimal and/or no interaction from a human driver present in the vehicle. A semi-autonomous (e.g., driver-assisted) operational mode can be one in which the autonomous vehicle operates with some interaction from a human driver present in the vehicle.

The autonomous vehicle 102 can include one or more sensors 104, a vehicle computing system 106, and one or more vehicle controls 108. The vehicle computing system 106 can assist in controlling the autonomous vehicle 102. In particular, the vehicle computing system 106 can receive sensor data from the one or more sensors 104, attempt to comprehend the surrounding environment by performing various processing techniques on data collected by the sensors 104, and generate an appropriate motion path through such surrounding environment. The vehicle computing system 106 can control the one or more vehicle controls 108 to operate the autonomous vehicle 102 according to the motion path.

The vehicle computing system 106 can include one or more processors 130 and at least one memory 132. The one or more processors 130 can be any suitable processing device (e.g., a processor core, a microprocessor, an ASIC, a FPGA, a controller, a microcontroller, etc.) and can be one processor or a plurality of processors that are operatively connected. The memory 132 can include one or more non-transitory computer-readable storage mediums, such as RAM, ROM, EEPROM, EPROM, flash memory devices, magnetic disks, etc., and combinations thereof. The memory 132 can store data 134 and instructions 136 which are executed by the processor 130 to cause vehicle computing system 106 to perform operations.

In some implementations, vehicle computing system 106 can further be connected to, or include, a positioning system 120. Positioning system 120 can determine a current geographic location of the autonomous vehicle 102. The positioning system 120 can be any device or circuitry for analyzing the position of the autonomous vehicle 102. For example, the positioning system 120 can determine actual or relative position by using a satellite navigation positioning system (e.g. a GPS system, a Galileo positioning system, the GLObal NAvigation Satellite System (GLONASS), the BeiDou Satellite Navigation and Positioning system), an inertial navigation system, a dead reckoning system, based on IP address, by using triangulation and/or proximity to cellular towers or WiFi hotspots, and/or other suitable techniques for determining position. The position of the autonomous vehicle 102 can be used by various systems of the vehicle computing system 106.

As illustrated in FIG. 1, in some embodiments, the vehicle computing system 106 can include a perception system 110, a prediction system 112, and a motion planning system 114 that cooperate to perceive the surrounding environment of the autonomous vehicle 102 and determine a motion plan for controlling the motion of the autonomous vehicle 102 accordingly.

In particular, in some implementations, the perception system 110 can receive sensor data from the one or more sensors 104 that are coupled to or otherwise included within the autonomous vehicle 102. As examples, the one or more sensors 104 can include a LIght Detection And Ranging (LIDAR) system 122, a RAdio Detection And Ranging (RADAR) system 124, one or more cameras 126 (e.g., visible spectrum cameras, infrared cameras, etc.), and/or other sensors 128. The sensor data can include information that describes the location of objects within the surrounding environment of the autonomous vehicle 102.

As one example, for LIDAR system 122, the sensor data can include the location (e.g., in three-dimensional space relative to the LIDAR system 122) of a number of points that correspond to objects that have reflected a ranging laser. For example, LIDAR system 122 can measure distances by measuring the Time of Flight (TOF) that it takes a short laser pulse to travel from the sensor to an object and back, calculating the distance from the known speed of light.

As another example, for RADAR system 124, the sensor data can include the location (e.g., in three-dimensional space relative to RADAR system 124) of a number of points that correspond to objects that have reflected a ranging radio wave. For example, radio waves (pulsed or continuous) transmitted by the RADAR system 124 can reflect off an object and return to a receiver of the RADAR system 124, giving information about the object's location and speed. Thus, RADAR system 124 can provide useful information about the current speed of an object.

As yet another example, for one or more cameras 126, various processing techniques (e.g., range imaging techniques such as, for example, structure from motion, structured light, stereo triangulation, and/or other techniques) can be performed to identify the location (e.g., in three-dimensional space relative to the one or more cameras 126) of a number of points that correspond to objects that are depicted in imagery captured by the one or more cameras 126. Other sensor systems 128 can identify the location of points that correspond to objects as well.

Thus, the one or more sensors 104 can be used to collect sensor data that includes information that describes the location (e.g., in three-dimensional space relative to the autonomous vehicle 102) of points that correspond to objects within the surrounding environment of the autonomous vehicle 102.

In addition to the sensor data, the perception system 110 can retrieve or otherwise obtain map data 118 that provides detailed information about the surrounding environment of the autonomous vehicle 102. The map data 118 can provide information regarding: the identity and location of different travelways (e.g., roadways), road segments, buildings, or other items or objects (e.g., lampposts, crosswalks, curbing, etc.); the location and directions of traffic lanes (e.g., the location and direction of a parking lane, a turning lane, a bicycle lane, or other lanes within a particular roadway or other travelway); traffic control data (e.g., the location and instructions of signage, traffic lights, or other traffic control devices); and/or any other map data that provides information that assists the vehicle computing system 106 in comprehending and perceiving its surrounding environment and its relationship thereto.

The perception system 110 can identify one or more objects that are proximate to the autonomous vehicle 102 based on sensor data received from the one or more sensors 104 and/or the map data 118. In particular, in some implementations, the perception system 110 can determine, for each object, state data that describes a current state of such object. As examples, the state data for each object can describe an estimate of the object's: current location (also referred to as position); current speed; current heading (current speed and heading also together referred to as velocity); current acceleration; current orientation; size/footprint (e.g., as represented by a bounding shape such as a bounding polygon or polyhedron); class (e.g., vehicle versus pedestrian versus bicycle versus other); yaw rate; and/or other state information.

In some implementations, the perception system 110 can determine state data for each object over a number of iterations. In particular, the perception system 110 can update the state data for each object at each iteration. Thus, the perception system 110 can detect and track objects (e.g., vehicles, pedestrians, bicycles, and the like) that are proximate to the autonomous vehicle 102 over time.

The prediction system 112 can receive the state data from the perception system 110 and predict one or more future locations for each object based on such state data. For example, the prediction system 112 can predict where each object will be located within the next 5 seconds, 10 seconds, 20 seconds, etc. As one example, an object can be predicted to adhere to its current trajectory according to its current speed. As another example, other, more sophisticated prediction techniques or modeling can be used.

The motion planning system 114 can determine a motion plan for the autonomous vehicle 102 based at least in part on the predicted one or more future locations for the object provided by the prediction system 112 and/or the state data for the object provided by the perception system 110. Stated differently, given information about the current locations of objects and/or predicted future locations of proximate objects, the motion planning system 114 can determine a motion plan for the autonomous vehicle 102 that best navigates the autonomous vehicle 102 relative to the objects at such locations.

As one example, in some implementations, the motion planning system 114 can determine a cost function for each of one or more candidate motion plans for the autonomous vehicle 102 based at least in part on the current locations and/or predicted future locations of the objects. For example, the cost function can describe a cost (e.g., over time) of adhering to a particular candidate motion plan. For example, the cost described by a cost function can increase when the autonomous vehicle 102 approaches a possible impact with another object and/or deviates from a preferred pathway (e.g., a preapproved pathway).

Thus, given information about the current locations and/or predicted future locations of objects, the motion planning system 114 can determine a cost of adhering to a particular candidate pathway. The motion planning system 114 can select or determine a motion plan for the autonomous vehicle 102 based at least in part on the cost function(s). For example, the candidate motion plan that minimizes the cost function can be selected or otherwise determined. The motion planning system 114 can provide the selected motion plan to a vehicle controller 116 that controls one or more vehicle controls 108 (e.g., actuators or other devices that control gas flow, acceleration, steering, braking, etc.) to execute the selected motion plan.

Each of the perception system 110, the prediction system 112, the motion planning system 114, and the vehicle controller 116 can include computer logic utilized to provide desired functionality. In some implementations, each of the perception system 110, the prediction system 112, the motion planning system 114, and the vehicle controller 116 can be implemented in hardware, firmware, and/or software controlling a general purpose processor. For example, in some implementations, each of the perception system 110, the prediction system 112, the motion planning system 114, and the vehicle controller 116 includes program files stored on a storage device, loaded into a memory, and executed by one or more processors. In other implementations, each of the perception system 110, the prediction system 112, the motion planning system 114, and the vehicle controller 116 includes one or more sets of computer-executable instructions that are stored in a tangible computer-readable storage medium such as RAM hard disk or optical or magnetic media.

Figure 2:
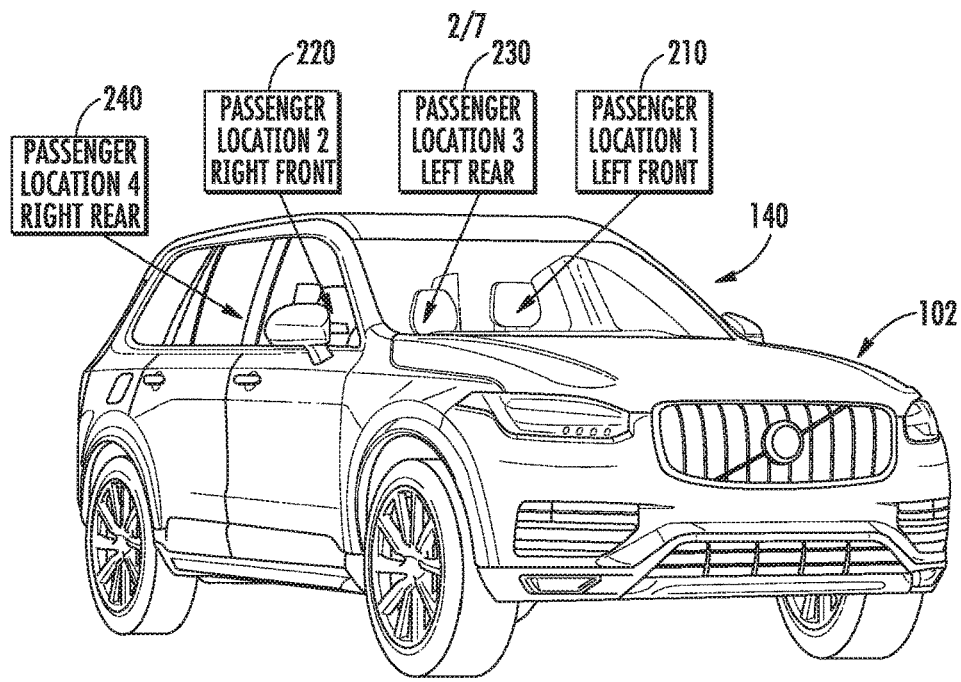
FIG. 2 depicts a perspective view of an example autonomous view with four passenger locations according to example aspects of the present disclosure.

FIG. 2 depicts a perspective view of an example autonomous vehicle according to example aspects of the present disclosure. As shown, a vehicle 102 can include a passenger compartment 140. The passenger compartment 140 can be configured to house one or more passengers during operation of the vehicle 102. For example, a passenger compartment can include one or more passenger locations. Each passenger location can be configured to accommodate a passenger. For example, as depicted in FIG. 2, a passenger compartment 140 can include a first passenger location 210, a second passenger location 220, a third passenger location 230, and a fourth passenger location 240. First passenger location 210 can be, for example, a left front seat (e.g., a driver's seat) wherein an operator can access vehicle controls to manually operate the vehicle 102. Second passenger location 220 can be, for example, a right front seat positioned next to the first passenger location 210. Third passenger location 230 and fourth passenger location 240 can be, for example, a left rear seat and a right rear seat, respectively. Each passenger location can include, for example, a seat, such as a bucket seat or a bench seat, and can include one or more safety restraints, such as a seatbelt, airbag(s), or other safety restraints.

While FIG. 2 depicts four passenger locations 210-240, one of ordinary skill in the art will recognize that in various implementations, a passenger compartment 140 can include any number of passenger locations. For example, certain micro or compact vehicles 102 may include only a single passenger location or a single row of passenger locations, while certain sport-utility and/or van vehicles 102 may include three or more rows of passenger locations, wherein each row includes a plurality of individual passenger locations.

Figure 3:
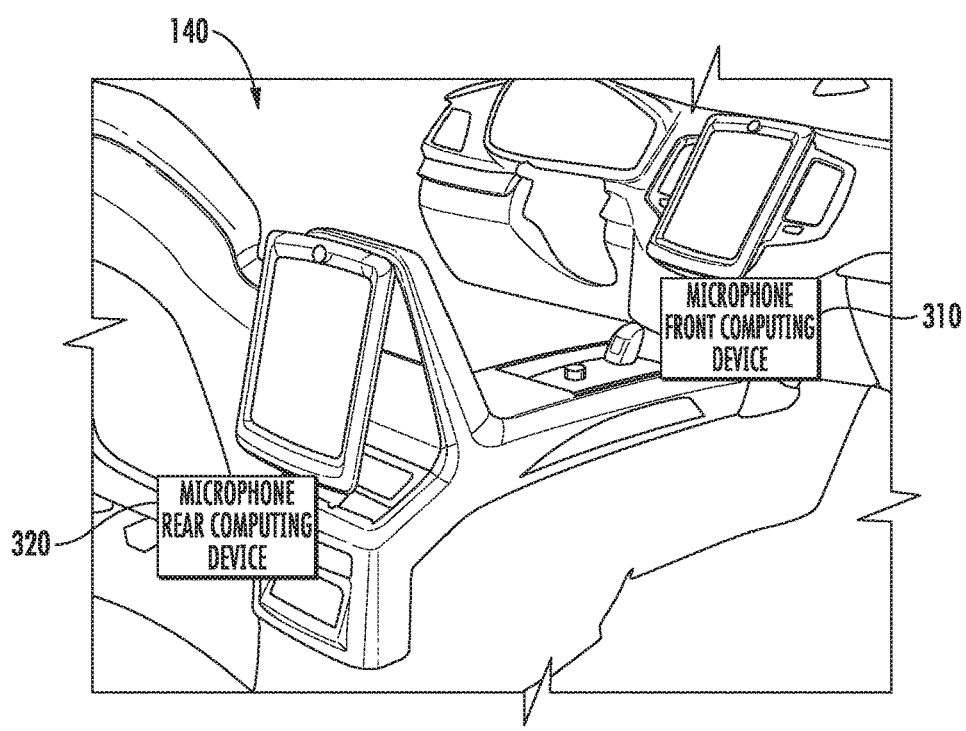
FIG. 3 depicts a perspective view of an example passenger compartment in an autonomous vehicle with example computing device locations accessible from a passenger location according to example aspects of the present disclosure.

FIG. 3 depicts a perspective view of an interior of a passenger compartment 140 in a vehicle 102. As shown, a passenger compartment 140 can include one or more computing devices. For example, as shown, a front computing device 310 can be positioned between two passenger locations in the front of a passenger compartment 140, and a second computing device 320 can be positioned between two passenger locations in the rear of a passenger compartment 140. In various implementations, any number of computing devices can be included in a passenger compartment 140.

In some implementations, a computing device, such as a front computing device 310 or a rear computing device 320, can be accessible from a passenger location. For example, as depicted in FIG. 3, front computing device 310 is positioned between a first passenger location 210 and a second passenger location 220 in the front of the passenger compartment 140, and a rear computing device 320 is positioned between a third passenger location 230 and a fourth passenger location 240 in the rear of the passenger compartment 140. In such a configuration, each computing device can be accessible from a passenger location. In various implementations, any number of configurations can be used in which a computing devices accessible from a passenger location. For example, in various implementations, each passenger location can have a computing device associated with the passenger location and accessible from the respective passenger location.

In some implementations, each computing device can include a microphone integrated into the computing device. For example, in various implementations, a computing device can be a tablet computer, such as a commercially available iPad or other tablet computer. The computing device can include a microphone which can allow a user to interact with the computing device using one or more vocal commands. For example, a passenger seated in a passenger location may desire to alter the destination that the autonomous vehicle 102 is traveling to. A passenger may be able to provide one or more verbal commands to a front computing device 310 or rear computing device 320 in order to input a new travel destination. In various implementations, a microphone integrated into a computing device can be configured to record sound levels during one or more operating conditions of the vehicle 102 and provide data indicative of the sound levels to a computing system in order to determine a noise level associated with the vehicle 102.

Figure 4:
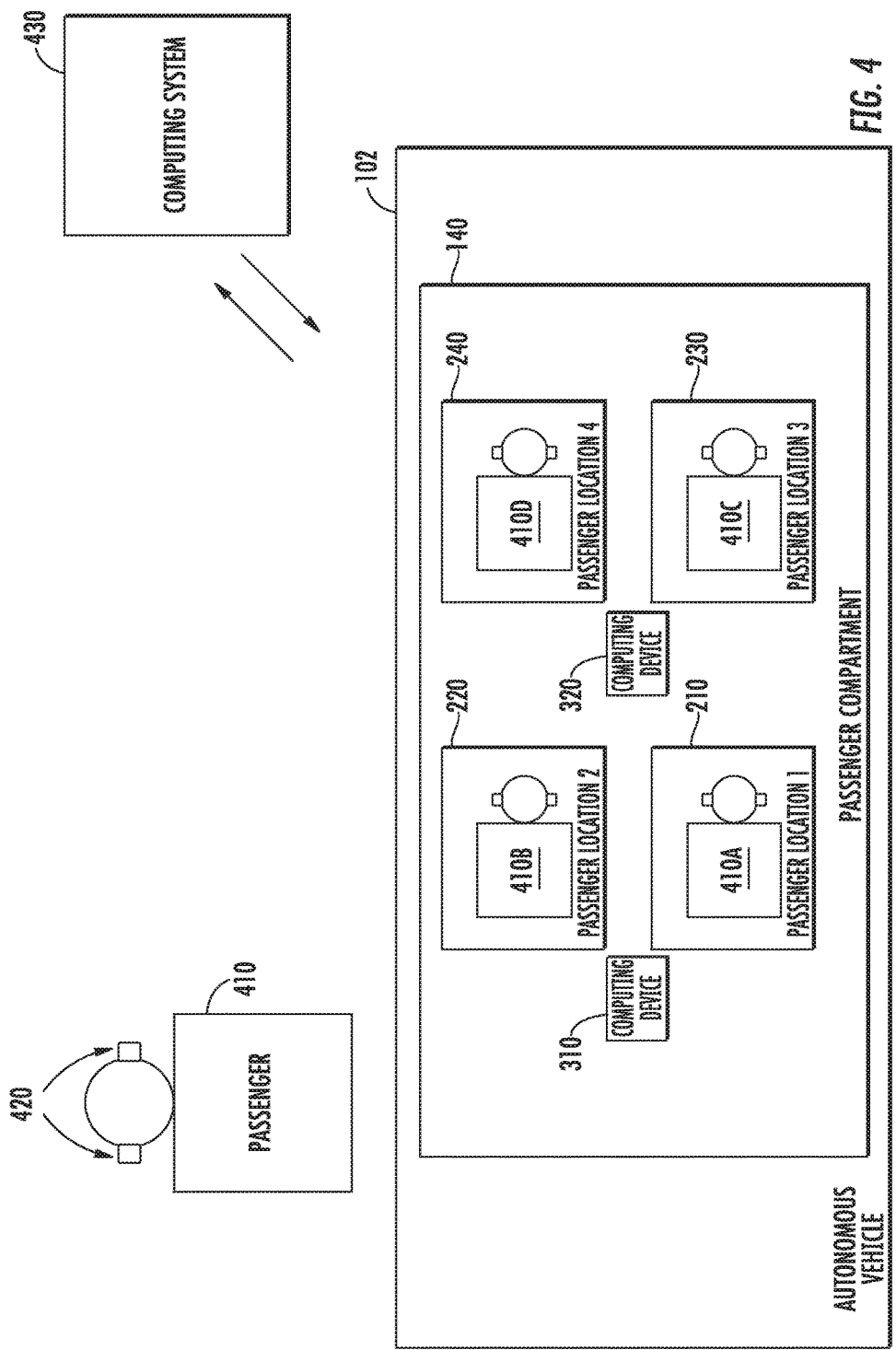
FIG. 4 depicts an example testing system for determining a noise level associated with an autonomous vehicle according to example aspects of the present disclosure.

Referring now to FIG. 4, a schematic of an example system 400 for determining a noise level associated with an autonomous vehicle is depicted. As shown, a vehicle 102 can include a passenger compartment 140 which can include one or more passenger locations and/or one or more computing devices accessible from a passenger location. For example, as shown in FIG. 4, the passenger compartment 140 includes four passenger locations 210, 220, 230, and 240, and two computing devices 310 and 320. In various implementations, any number of passenger locations and/or computing devices can be included in a passenger compartment 140.

The system 400 can include one or more microphones positioned at one or more passenger locations in the passenger compartment 140. In some implementations, at least one of the microphones in the system 400 can be positioned at a passenger location in the rear of the passenger compartment. For example, third passenger location 230 and fourth passenger location 240 can be two passenger locations in a rear seat of the vehicle 102. One or more microphones can be positioned at one or more of the third passenger location 230 and the fourth passenger location 240. For example, a single microphone can be positioned at either the third passenger location 230 or the fourth passenger location 240, or a respective microphone can be positioned at each of the third passenger location 230 and the fourth passenger location 240. An advantage provided by positioning one or more microphones at one or more passenger locations in the rear of the vehicle is that a noise level associated with the autonomous vehicle can be determined that is reflective of noises experienced by passenger(s) in the rear of the autonomous vehicle, which can be used to improve the experience for these passengers.

In some implementations, each passenger location can have one or more microphones positioned at the passenger location, wherein each microphone is configured to obtain data indicative of a sound level at each respective passenger location. An advantage provided by positioning one or more microphones at each passenger location is that a noise level associated with the autonomous vehicle can be determined that is reflective of noises experienced by all passengers in the autonomous vehicle, which can be used to improve the experience for all passengers that may travel in the autonomous vehicle.

In some implementations, the one or more microphones can include a microphone assembly positioned at the passenger location. For example a microphone assembly can include one or more microphones coupled to one or more respective multi-axis stands configured to position each microphone at the passenger location.

In some implementations, the one or more microphones can include one or more pairs of binaural microphones 420. The pair of binaural microphones can include two pieces, and each piece can include a microphone. Thus, the pair of binaural microphones can include two separate channels for recording a noise level. In some implementations, each piece in the pair of binaural microphones can further include an audio speaker/driver configured to produce sound for the wearer.

In some implementations, the one or more microphones can include one or more pairs of binaural microphones positioned on a passenger and/or passenger analogue 410. As used herein, the terms "passenger" and "passenger analogue" refer to a human passenger or human simulaid, such as a manikin or dummy, and can be used interchangeably. For example, a pair of binaural microphones 420 can be earbud style binaural microphones configured to be positioned within or adjacent to the ear of a passenger or passenger analogue 410. Other types of binaural microphones 420 can similarly be used. In some implementations, the system 400 can include one or more pairs of binaural microphones positioned on a passenger/passenger analogue 410 positioned at a passenger location. For example, as shown in FIG. 4, four passenger/passenger analogues 410A-D can each wear a pair of binaural microphones 420 while seated in passenger locations 210-240, respectively. In various implementations, any number of passenger/passenger analogues 410 can be positioned at any number of passenger locations 210-240 in a system 400.

Additionally, the system 400 can include one or more microphones integrated into one or more computing devices accessible from a passenger location. For example, as depicted in FIG. 4, front computing device 310 and rear computing device 320 can include microphones integrated into the computing device, and can be configured to obtain data indicative of a sound level through the integrated microphones. An advantage provided by positioning one or more microphones at one or more computing device locations and/or using one or more microphones integrated into one or more computing devices is that a noise level associated with the autonomous vehicle can be determined that is reflective of noises experienced in the location(s) of the one or more computing devices, which can be used to identify issues and improve the location of the computing devices so as to improve verbal command capabilities associated with user interaction and autonomous operation of the autonomous vehicle. In some implementations, any number of computing devices 310, 320 can be included in a system 400.

The system 400 can further include a computing system 430. The computing system can include one or more computing devices, which can include one or more processors and one or more memory devices, as described herein. The computing system 430 can be configured to receive data indicative of a sound level from one or more microphones positioned at one or more locations in a passenger compartment of an autonomous vehicle. The computing system 430 can further can be configured to determine a noise level associated with the autonomous vehicle based at least in part on the data received.

For example, the computing system can be configured to receive data indicative of a sound level from one or more computing devices 310, 320 and/or one or more microphones positioned at one or more passenger locations 210-240. For example, the computing system 430 can be configured to receive first data indicative of a first sound level from one or more microphones with the autonomous vehicle operating at a first operating condition. Following an operating condition change from the first operating condition to a second operating condition, the computing system 430 can further be configured to receive second data indicative of a second sound level from the one or more microphones. In some implementations, the computing system can further be configured to determine a noise level associated with the autonomous vehicle based at least in part on the first data and the second data.

FIG. 4 depicts one example configuration for a passenger compartment 140 of an autonomous vehicle 102. In other implementations, a passenger compartment 140 can include various other suitable configurations. For example, in some implementations, a passenger compartment 140 can be configured as a "rolling office" wherein a passenger location 210-240 is configured to allow a passenger 410 to perform tasks associated with a job. For example, a workspace, such as a desk, can be included in a passenger location 210-240. In some implementations, a passenger compartment 140 can be configured for other purposes, such as passenger compartments tailored for family vacations, passenger compartments tailored for transporting passengers in an entertainment district, or other configurations.

The systems and methods provided herein can be applied to such passenger compartment 140 configurations. For example, noise levels suitable for such specific passenger compartment 140 configurations can be determined in order to provide an environment conducive to the specific use of the autonomous vehicle 102. For example, noise levels suitable for use in a "rolling office" may need to be lower than noise levels suitable for use in an autonomous vehicle 102 used primarily to transport passengers in an entertainment district. The systems and methods provided herein can be used to determine noise levels suitable for such passenger compartment 140 configurations, and further, such noise levels can be used in design decisions for an autonomous vehicle 102.

Figure 5:
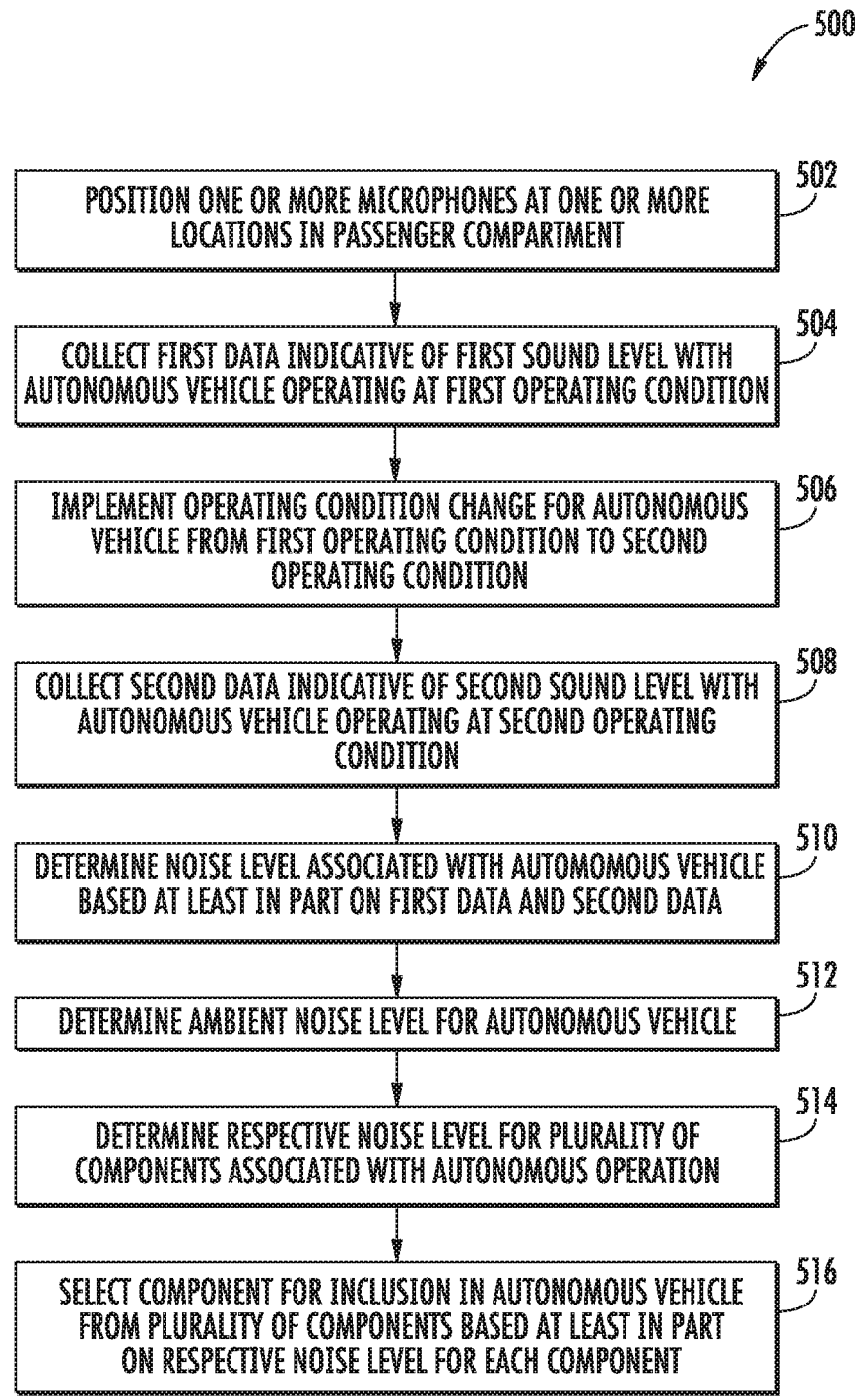
FIG. 5 depicts a flow diagram of an example method according to example aspects of the present disclosure.

Referring now to FIG. 5, a flow chart depicting an example method (500) for determining a noise level associated with an autonomous vehicle is shown. Aspects of method (500) may be implemented by a computing system, such as computing system 430 depicted in FIGS. 4 and 8. In addition, FIG. 5 depicts steps performed in a particular order for purposes of illustration and discussion. Those of ordinary skill in the art, using the disclosures provided herein, will understand that various steps of any of the methods disclosed herein can be adapted, omitted, rearranged, or expanded in various ways without deviating from the scope of the present disclosure.

At (502), the method (500) can include positioning one or more microphones at one or more locations in a passenger compartment of an autonomous vehicle. For example, one or more microphones can be positioned at one or more passenger locations 210-240 in the passenger compartment 140, and/or the one or more microphones can be positioned at one or more computing device locations accessible from one or more passenger locations 210-240 in the passenger compartment 140. In some implementations, the one or more microphones can be one or more pairs of binaural microphones 420 and/or one or more microphones integrated into a computing device 310, 320. In some implementations, the one or more microphones can be positioned at one or more other locations in the passenger compartment 140.

At (504), the method (500) can include collecting first data indicative of a first sound level with the autonomous vehicle operating at a first operating condition. For example, the one or more microphones can be configured to record a first sound level while the autonomous vehicle is operating at a first operating condition, and can be configured to provide data indicative of the recorded first sound level to a computing system 430. In various implementations, the one or more microphones can be configured to communicate via one or more wired or and/or wireless communication network(s). In various implementations, data indicative of a first sound level with the autonomous vehicle operating at the first operating condition can be collected from a plurality of microphones, such as a plurality of microphones at a plurality of passenger locations and/or computing device locations. In this way, the one or more microphones can collect first data indicative of the first sound level at the first operating condition, and can provide the first data to the computing system 430.

The first operating condition can be, for example, an operating condition in which the autonomous vehicle 102 is powered off, while the autonomous vehicle 102 is at rest, while the autonomous vehicle 102 is operated at a first speed, while the autonomous vehicle 102 is operated on a first type of road, while the autonomous vehicle 102 is operated in a first weather condition, or any other operating condition. The first data can be obtained while the autonomous vehicle 102 is operating at the first operating condition. For example, first data indicative of a first sound level can be recorded while an autonomous vehicle 102 is powered on, but stationary.

In some implementations, the first operating condition can include operating the autonomous vehicle 102 while a component associated with autonomous vehicle operation is not installed in the autonomous vehicle 102, or while an installed component associated with autonomous operation is unpowered. For example, first data indicative of a first sound level can be recorded before installing a component associated with autonomous operation, such as before installing a camera, a LIDAR sensor, a RADAR sensor, or other component associated with autonomous operation. In some implementations, the first data indicative of a first sound level can similarly be recorded while the component associated with autonomous operation has been installed, but while the component is powered off. For example, a LIDAR sensor can be mounted to the autonomous vehicle 102, but can be powered off while the first data indicative of the first sound level is recorded. Thus, in some implementations, determining a noise level associated with the autonomous vehicle can include determining a noise level associated with a component used for autonomous operation of the autonomous vehicle.

In some implementations, the first operating condition can be an operating condition in which a passenger is communicating verbally (e.g., talking), while a passenger is not communicating verbally (e.g., is silent), or while a passenger is communicating at a first communication level (e.g., volume level, communication pace, etc.). For example, a first passenger 410A can be positioned in a first passenger location 210, and a second passenger 410B can be positioned in a second passenger location 220. In some implementations, collecting first data during a first operating condition can include, for example, collecting first data indicative of a first sound level while the first passenger 410A communicates verbally with the second passenger 410B. In some implementations, a first data indicative of a first sound level can be obtained while a first passenger 410A communicates with a computing device 310, 320.

At (506), the method (500) can include implementing an operating condition change for the autonomous vehicle from the first operating condition to a second operating condition. The second operating condition can be a changed operating condition from the first operating condition.

For example, a second operating condition can be while the autonomous vehicle is moving, while the autonomous vehicle is operated at a second speed, while the autonomous vehicle is operated on a second type of road, while the autonomous vehicle is operated in a second weather condition, or other operating condition which is different from the first operating condition. Second data indicative of the second sound level at the second operating condition can similarly be provided to the computing system 430 by the one or more microphones.

Similarly, in some implementations, a second operating condition can be an operating condition in which a component associated with autonomous vehicle operation has been installed in the autonomous vehicle 102 or when the component associated with autonomous vehicle operation is powered on. For example, second data indicative of a second sound level can be recorded after installing a LIDAR sensor, or while the LIDAR sensor is powered on.

Further, in some implementations, a second operating condition can be a condition in which the first passenger 410A ceases communicating verbally, begins communicating verbally, or changes his/her verbal communication level. For example, second data indicative of a second sound level during a second operating condition can be obtained after the first passenger 410A stops talking or talks at a reduced volume level. Similarly, an operating condition change can include having a silent passenger 410A begin talking, or talking more loudly. In this way, an operating condition change can be implemented from the first operating condition to a second operating condition by changing at least one operating condition.

At (508), the method (500) can include collecting second data indicative of a second sound level by the one or more microphones. For example, following the operating condition change, the one or more microphones positioned in the passenger compartment 140 can record a second sound level at the second operating condition. Further, in some implementations, the one or more microphones can be configured to provide second data indicative of the second sound level at the second operating condition to the computing system 430.

At (510), the method (500) can include determining a noise level associated with the autonomous vehicle based at least in part on the first data and second data. For example, the computing system 430 can be configured to analyze the first data and the second data in order to determine a noise level associated with the autonomous vehicle, such as by comparing the sound levels of the first data and the second data at one or more operating conditions. Various processing techniques can be applied to the first data and second data to analyze noise levels associated with the autonomous vehicle. In some implementations, additional data indicative of sound levels, such as additional data indicative of sound levels with the autonomous vehicle operating at additional operating conditions, can also be used to determine a noise level associated with the autonomous vehicle. In some implementations, determining a noise level associated with an autonomous vehicle can include determining a noise level associated with a component used for autonomous operation.

At (512), in some implementations, the method (500) can include determining an ambient noise level for the autonomous vehicle. As used herein, the term "ambient" when used in reference to an operating condition, a sound level, or a noise level refers to a respective operating condition, sound level, or noise level in which either a component used for autonomous operation is either not installed in the autonomous vehicle or not powered on. For example, in some implementations, an autonomous vehicle can be operated in a plurality of ambient operating conditions, and respective data indicative of an ambient sound level is obtained for each respective ambient operating condition.

For example, an autonomous vehicle without a component used for autonomous operation installed can be operated over a variety of road surfaces, weather conditions, and/or other operating conditions, and respective data indicative of ambient sound levels for each ambient operating condition can be obtained by one or more microphones. The respective data indicative of ambient sound levels can be provided to a computing system, such as a computing system 430. Using various processing techniques on the respective data indicative of ambient sound levels, an ambient noise level can be determined. For example, an ambient noise level can be indicative of a baseline noise level for the autonomous vehicle without the component used for autonomous operation of the vehicle installed. In some implementations, the ambient noise level can be used as a threshold noise level for any components added to the autonomous vehicle. For example, a manufacturer/operator can choose a mounting bracket that has a noise level that does not exceed the ambient noise level. Further, the ambient noise level can be used in order to develop specifications for acceptable noise levels for components added to the autonomous vehicle, such as design specifications provided to component manufacturers.

At (514), the method (500) can include determining a respective noise level for a plurality of components associated with autonomous operation. For example, a manufacturer or an operator of an autonomous vehicle may desire to limit the incremental noise introduced by added components in an autonomous vehicle in order to improve a passenger experience while riding in the autonomous vehicle. For example, the manufacturer/operator may be considering two different mounting brackets to use for mounting a LIDAR system to the autonomous vehicle. Using example aspects of the present disclosure, the manufacturer/operator can determine a noise level for each mounting bracket by, for example, obtaining data indicative of sound levels while the autonomous vehicle is operated in one or more operating conditions for each separate mounting bracket. Using data processing techniques, a respective noise level for each mounting bracket can be determined.

In some implementations, determining a noise level for a component used for autonomous operation can include determining an ambient noise level. For example, an ambient noise level without the component installed or without the component powered on can first be determined. A noise level for the component used for autonomous operation can then be determined by installing or powering on the component. In some implementations, a noise level for a component used for autonomous operation can be determined by comparing data indicative of an ambient sound level at one or more ambient operating conditions to data indicative of a sound level at one or more operating conditions with the component installed or powered on.

At (516), the method (500) can include selecting a component for inclusion in an autonomous vehicle from the plurality of components based at least in part on the respective noise level for each component. For example, after determining a respective noise level for each component in a plurality of components, the manufacturer/operator can then select a component for inclusion in the autonomous vehicle. For example, in various implementations, a manufacturer/operator can select a component with a noise level below a threshold noise level, or a component with a lower noise level as compared to one or more other components in the plurality, or a component with a noise level below an ambient noise level.

In this way, example aspects of method (500) can enable determining a noise level associated with an autonomous vehicle. In some implementations, a noise level for a component used for autonomous operation can be determined. In some implementations, an ambient noise level for the autonomous vehicle can be determined. In some implementations, a noise level for a plurality of components can be determined, and further, a component can be selected for inclusion in an autonomous vehicle based at least in part on the respective noise level of the component. In this way, the method (500) can allow for improved passenger experiences by enabling design decisions to be made for an autonomous vehicle based on one or more noise levels associated with the autonomous vehicle.

Figure 6:
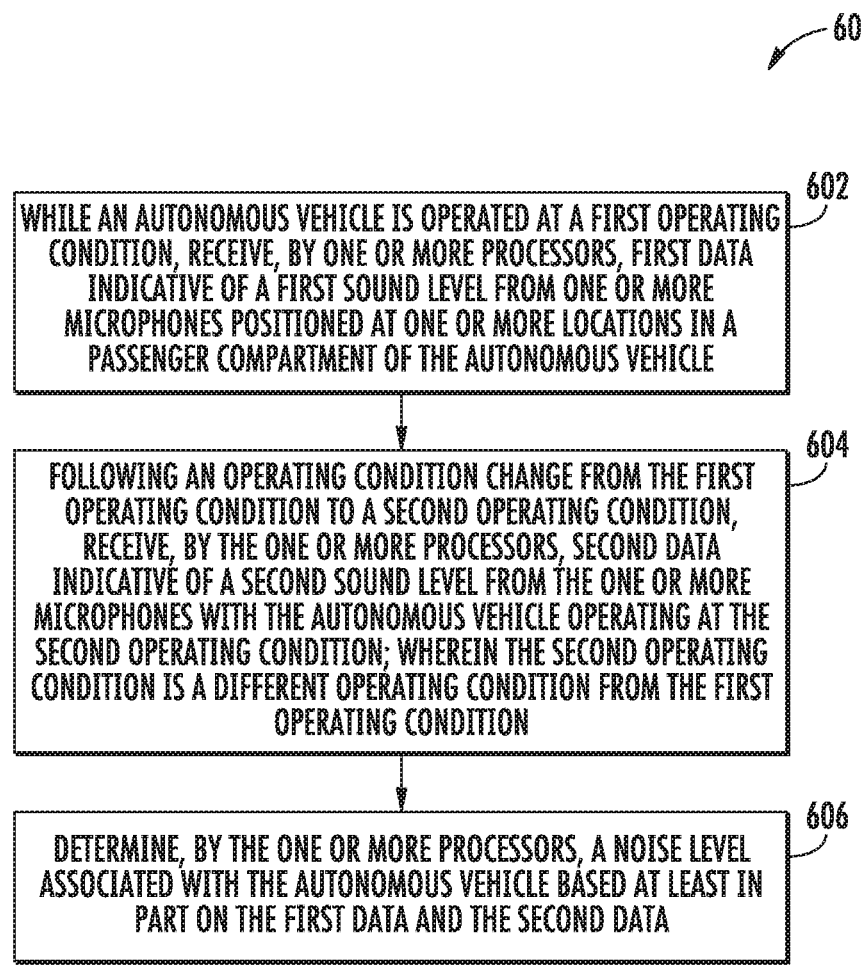
FIG. 6 depicts a flow diagram of an method executable by a computer readable medium according to example aspects of the present disclosure.

Referring now to FIG. 6, a method (600) which can be implemented by one or more non-transitory computer-readable media is depicted. The non-transitory computer-readable media can collectively store instructions that, when executed by one or more processors, cause a computing system to perform the operations depicted in FIG. 6.

While an autonomous vehicle is operated at a first operating condition, at (602), the method (600) can include receiving, by one or more processors, first data indicative of a first sound level from one or more microphones positioned at one or more locations in a passenger compartment of an autonomous vehicle. The one or more microphones can be positioned at, for example, one or more passenger locations 210-240, one or more locations of a computing device 310, 320, or another location within a passenger compartment 140 of an autonomous vehicle 102. The one or more microphones can be configured to provide data to a computing system, such as a computing system 430. The computing system 430 can include one or more processors, which can receive first data indicative of a first sound level from the one or more microphones.

Following an operating condition change from the first operating condition to a second operating condition, at (604), the method (600) can include receiving, by the one or more processors, second data indicative of a second sound level from the one or more microphones with the autonomous vehicle operating at the second operating condition. The one or more microphones can be configured to provide the second data to the computing system 430. The computing system 430 can receive the second data indicative of the second sound level from the one or more microphones.

The second operating condition can be a different operating condition from the first operating condition. For example, the changed operating condition can be a change in whether the autonomous vehicle 102 is powered on or off, a change in whether a component is added to or removed from the autonomous vehicle 102, a change in the speed of the autonomous vehicle 102, a change in a road surface on which the autonomous vehicle 102 is operated, or a change in a weather condition in which the autonomous vehicle 102 is operated.

Further, the second operating condition can be a change in whether a passenger is communicating verbally or a change in a passenger's verbal communication level. For example, a passenger 410 can begin talking, cease talking, talk at a different volume level, talk at a different pace, or any other verbal communication change.

In some implementations, the method (600) can be used to determine a noise level associated with a component used for autonomous operation of the autonomous vehicle. In some implementations, the second operating condition can be a change in whether the component used for autonomous operation is powered on or off. For example, at a first operating condition, a LIDAR array can be powered off, and for a second operating condition, the LIDAR array can be powered on.

At (606), the method (600) can include determining, by the one or more processors, a noise level associated with the autonomous vehicle based at least in part on the first data and the second data. For example, the computing system 430 can be configured to analyze the first data and the second data in order to determine a noise level associated with the autonomous vehicle, such as by comparing the sound levels of the first data and the second data at one or more operating conditions.

Figure 7:
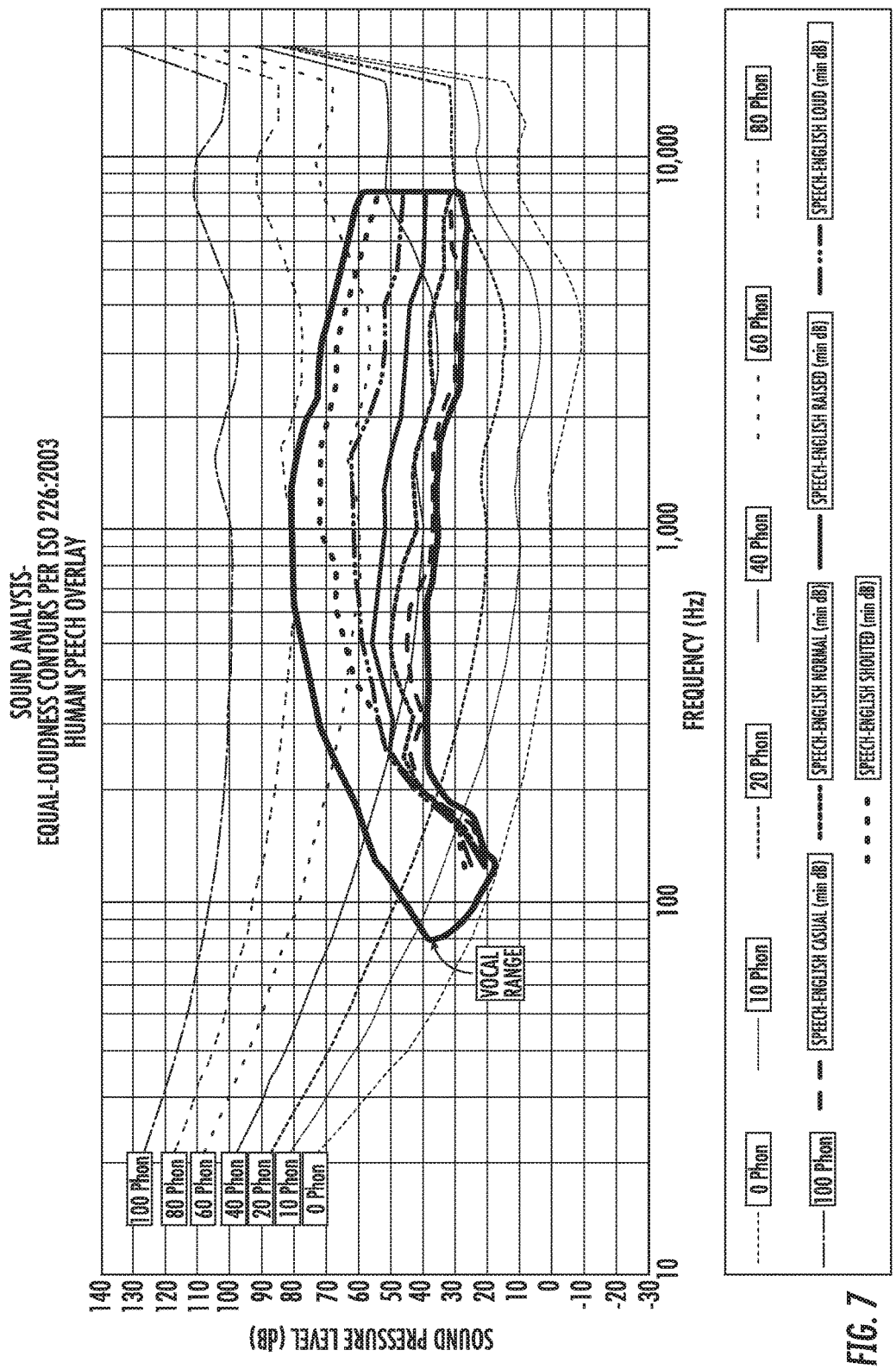
FIG. 7 depicts an example graph of various loudness contours at differing sound pressure levels according to example aspects of the present disclosure.

Referring now to FIG. 7, a graph showing several equal loudness contours or "noise rating curves" as measured in phon on a graph of sound pressure levels (dB SPL) and frequency (Hz) is shown. By definition, the number of phon of a sound is the dB SPL at a frequency of 1000 Hz that sounds as loud. As depicted, a first loudness contour (0 phon), a second loudness contour (20 phon), a third loudness contour (40 phon), a fourth loudness contour (60 phon), a fifth loudness contour (80 phon), and a sixth loudness contour (100 phon) are shown. Each loudness contour maps the perceived loudness of a sound pressure (dB SPL) for various tonal frequencies. The typical human threshold for hearing is zero phon, and the typical human threshold for pain is 100 phon. Also depicted is an estimated human auditory range for vocal sounds, which includes loudness contours for casual speech, normal speech, raised speech, loud speech, and shouted speech.

In some implementations, the systems and methods according to example aspects of the present disclosure can be used to determine noise levels corresponding to equal loudness contours or "noise rating curves" as shown in FIG. 7. For example, in some implementations, a noise level can be a noise rating curve as measured in phon. In some implementations, an ambient noise level can correspond to an ambient noise rating curve. In some implementations, a component to be added to a car can be determined to be acceptable if the loudness as measured in phon on the noise rating curve for the component is lower than the ambient noise rating curve within a particular frequency band. Further, in some implementations, the noise level for an autonomous vehicle as expressed in a noise rating curve can be used to set acceptable noise levels for manufacturing specifications, such as for manufacturing specifications for components to be added to the autonomous vehicle. In some implementations, one or more noise rating curves can be used to set acceptable levels to ensure certain sound and/or speech can be heard by a passenger, such as passenger-to-passenger communications, emergency vehicle sounds (e.g., sirens), communications from a remote operator, such as a vehicle fleet operator communicating to a passenger via a remote computing system, and/or other sounds.

FIG. 8 depicts an example computing system 800 according to example aspects of the present disclosure. The example system 800 illustrated in FIG. 8 is provided as an example only. The components, systems, connections, and/or other aspects illustrated in FIG. 8 are optional and are provided as examples of what is possible, but not required, to implement the present disclosure. The example system 800 can include a remote computing system 430 that is remote from the vehicle 102, and in some implementations, the vehicle computing system 106 of the vehicle 102, and that can be communicatively coupled to one another over one or more networks 820. The remote computing system 430 can be associated with a central operations system and/or an entity associated with the vehicle 102 such as, for example, a vehicle owner, vehicle manager, fleet operator, service provider, etc.

The computing system 430 can include processor(s) 802 and a memory 804. The one or more processors 802 can be any suitable processing device (e.g., a processor core, a microprocessor, an ASIC, a FPGA, a controller, a microcontroller, etc.) and can be one processor or a plurality of processors that are operatively connected. The memory 804 can include one or more non-transitory computer-readable storage media, such as RAM, ROM, EEPROM, EPROM, one or more memory devices, flash memory devices, etc., and combinations thereof.

The memory 804 can store information that can be accessed by the one or more processors 802. For instance, the memory 804 (e.g., one or more non-transitory computer-readable storage mediums, memory devices) can include computer-readable instructions 806 that can be executed by the one or more processors 802. The instructions 806 can be software written in any suitable programming language or can be implemented in hardware. Additionally, or alternatively, the instructions 806 can be executed in logically and/or virtually separate threads on processor(s) 802.

For example, the memory 804 can store instructions 806 that when executed by the one or more processors 802 cause the one or more processors 802 (the computing system 430) to perform operations such as any of the operations and functions of the computing system 430 or for which the computing system 430 is configured, as described herein and including, for example, some or all of the steps shown in methods 500 and 600 in FIGS. 5 and 6.

The memory 804 can store data 808 that can be obtained, received, accessed, written, manipulated, created, and/or stored. The data 808 can include, for instance, data indicative of a sound level obtained by one or more microphones, such as one or more pairs of binaural microphones 420 and/or one or more microphones integrated into one or more computing devices 310, 320. In some implementations, the computing system 430 can obtain data from one or more memory system that are remote from the computing system 430.

The computing system 430 can also include a communication interface 809 used to communicate with one or more other external devices, such as one or more microphones. The communication interface 809 can include any circuits, components, software, etc. for communicating with one or more networks (e.g., 820). In some implementations, the communication interface 809 can include for example, one or more of a communications controller, receiver, transceiver, transmitter, port, conductors, software and/or hardware for communicating data.

The network(s) 820 can be any type of network or combination of networks that allows for communication between devices. In some embodiments, the network(s) can include one or more of a local area network, wide area network, the Internet, secure network, Bluetooth, cellular network, mesh network, peer-to-peer communication link and/or some combination thereof and can include any number of wired or wireless links. Communication over the network(s) 820 can be accomplished, for instance, via a communication interface using any type of protocol, protection scheme, encoding, format, packaging, etc.

The computing system 430 can further be configured to communicate with a vehicle computing system 106 which is remote from the computing system 430. The vehicle computing system can include components (e.g., processor(s), memory, instructions, data) similar to that described herein for the computing system 430.

Computing tasks discussed herein as being performed at computing system 430 remote from the vehicle can instead be performed at the vehicle (e.g., via the vehicle computing system 106), or vice versa. Such configurations can be implemented without deviating from the scope of the present disclosure. The use of computer-based systems allows for a great variety of possible configurations, combinations, and divisions of tasks and functionality between and among components. Computer-implemented operations can be performed on a single component or across multiple components. Computer-implements tasks and/or operations can be performed sequentially or in parallel. Data and instructions can be stored in a single memory device or across multiple memory devices.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents.

What is claimed is:

1. A method for determining a noise level associated with an autonomous vehicle, the autonomous vehicle comprising a passenger compartment configured to house one or more passengers, the method comprising:

positioning one or more microphones at one or more locations in the passenger compartment;

collecting first data indicative of a first sound level by the one or more microphones with the autonomous vehicle operating at a first operating condition;

implementing an operating condition change for the autonomous vehicle from the first operating condition to a second operating condition;

while the autonomous vehicle is operated at the second operating condition, collecting second data indicative of a second sound level by the one or more microphones; and determining a noise level associated with the autonomous vehicle based at least in part on the first data and the second data;

wherein the one or more microphones comprise one or more of: a pair of binaural microphones positioned on a passenger or a passenger analogue, or a microphone integrated into a computing device accessible from a passenger location.

2. The method of claim 1, wherein implementing an operating condition change for the autonomous vehicle comprises powering the autonomous vehicle on, powering the autonomous vehicle off, adding a component to the autonomous vehicle, removing a component from the autonomous vehicle, changing a speed of the autonomous vehicle, changing a road surface on which the autonomous vehicle is operated, or changing a weather condition in which the autonomous vehicle is operated.

3. The method of claim 1, wherein implementing an operating condition change for the autonomous vehicle comprises having a passenger communicate verbally, having a passenger cease communicating verbally, or changing a passenger's verbal communication level.

4. The method of claim 1, wherein the noise level associated with the autonomous vehicle comprises a noise level associated with a component used for an autonomous operation of the autonomous vehicle.

5. The method of claim 4, wherein prior to determining a noise level for the component associated with autonomous operation, the method further comprises:

receiving respective data indicative of an ambient sound level for a plurality of ambient operating conditions; and determining an ambient noise level for the autonomous vehicle based at least in part on each respective data indicative of an ambient sound level in the plurality;

wherein for each ambient operating condition in the plurality, the component used for autonomous operation is either not installed in the autonomous vehicle or not powered on.

6. The method of claim 4, wherein implementing an operating condition change for the autonomous vehicle comprises either powering the component used for the autonomous operation on or powering the component used for the autonomous operation off.

7. The method of claim 4, wherein the method is performed to determine a respective noise level for each of a plurality of components used for autonomous operation, and wherein the method further comprises:

selecting a component from the plurality of components for inclusion in the autonomous vehicle based at least in part on the respective noise level for each component.

8. The method of claim 1, wherein at least one of the one or more microphones is positioned at a passenger location in a rear of the passenger compartment.

9. One or more non-transitory computer-readable media that collectively store instructions that, when executed by one or more processors, cause a computing system to perform operations, the operations comprising:

while an autonomous vehicle is operated at a first operating condition, receiving, by the one or more processors, first data indicative of a first sound level from one or more microphones positioned at one or more locations in a passenger compartment of the autonomous vehicle;

following an operating condition change from the first operating condition to a second operating condition, receiving, by the one or more processors, second data indicative of a second sound level from the one or more microphones with the autonomous vehicle operating at the second operating condition; wherein the second operating condition is a different operating condition from the first operating condition; and determining, by the one or more processors, a noise level associated with the autonomous vehicle based at least in part on the first data and the second data;

wherein the one or more microphones positioned at one or more locations in the passenger compartment of the autonomous vehicle comprise one or more of: a pair of binaural microphones positioned on a passenger or a passenger analogue, or a microphone integrated into a computing device accessible from a passenger location.

10. The non-transitory computer-readable media of claim 9, wherein the changed operating condition comprises a change in whether the autonomous vehicle is powered on or off, a change in whether a component is added to or removed from the autonomous vehicle, a change in a speed of the autonomous vehicle, a change in a road surface on which the autonomous vehicle is operated, or a change in a weather condition in which the autonomous vehicle is operated.

11. The non-transitory computer-readable media of claim 9, wherein the second operating condition comprises a change in whether a passenger is communicating verbally or a change in a passenger's verbal communication level.

12. The non-transitory computer-readable media of claim 9, wherein the noise level associated with the autonomous vehicle comprises a noise level associated with a component used for autonomous operation of the autonomous vehicle.

13. The non-transitory computer-readable media of claim 12, wherein the second operating condition results from a changed operating condition, wherein the changed operating condition comprises a change in whether the component used for autonomous operation is powered on or off.

14. A testing system for determining a noise level associated with an autonomous vehicle, the autonomous vehicle comprising a passenger compartment configured to house one or more passengers, the testing system comprising:

one or more microphones positioned at one or more locations in the passenger compartment; and a computing system comprising one or more processors and one or more tangible, non-transitory computer readable media that collectively store instructions that when executed by the one or more processors cause the computing system to perform operations, the operations comprising:

receiving first data indicative of a first sound level from the one or more microphones with the autonomous vehicle operating at a first operating condition;

receiving second data indicative of a second sound level from the one or more microphones with the autonomous vehicle operating at a second operating condition; and determining a noise level associated with the autonomous vehicle based at least in part on the first data and the second data;

wherein the second operating condition is different from the first operating condition; and wherein the one or more microphones positioned at one or more locations in the passenger compartment comprise one or more of: a pair of binaural microphones positioned on a passenger or a passenger analogue, or a microphone integrated into a computing device accessible from a passenger location.

15. The testing system of claim 14, wherein the second operating condition results from a changed operating condition, wherein the changed operating condition comprises a change in whether the autonomous vehicle is powered on or off, a change in whether a component is added to or removed from the autonomous vehicle, a change in a speed of the autonomous vehicle, a change in a road surface on which the autonomous vehicle is operated, a change in a weather condition in which the autonomous vehicle is operated, a change in whether a passenger is communicating verbally, a change in a passenger's verbal communication level, or a change in whether a component used for autonomous operation is powered on or off.

16. The testing system of claim 14, wherein at least one of the one or more microphones is positioned at a passenger location in a rear of the passenger compartment.

17. The testing system of claim 14, wherein the one or more microphones comprise a pair of binaural microphones positioned on a passenger or a passenger analogue.

18. The testing system of claim 14, wherein the one or more microphones comprise at least one microphone integrated into a computing device accessible from a passenger location.

19. A method for determining a noise level associated with an autonomous vehicle, the autonomous vehicle comprising a passenger compartment configured to house one or more passengers, the method comprising:

positioning one or more microphones at one or more locations in the passenger compartment;

collecting first data indicative of a first sound level by the one or more microphones with the autonomous vehicle operating at a first operating condition;

implementing an operating condition change for the autonomous vehicle from the first operating condition to a second operating condition;

while the autonomous vehicle is operated at the second operating condition, collecting second data indicative of a second sound level by the one or more microphones; and determining a noise level associated with the autonomous vehicle based at least in part on the first data and the second data;

wherein implementing an operating condition change for the autonomous vehicle comprises having a passenger communicate verbally, having a passenger cease communicating verbally, or changing a passenger's verbal communication level.

20. A method for determining a noise level associated with an autonomous vehicle, the autonomous vehicle comprising a passenger compartment configured to house one or more passengers, the method comprising:

positioning one or more microphones at one or more locations in the passenger compartment;

collecting first data indicative of a first sound level by the one or more microphones with the autonomous vehicle operating at a first operating condition;

implementing an operating condition change for the autonomous vehicle from the first operating condition to a second operating condition;

while the autonomous vehicle is operated at the second operating condition, collecting second data indicative of a second sound level by the one or more microphones;

receiving respective data indicative of an ambient sound level for a plurality of ambient operating conditions;

determining an ambient noise level for the autonomous vehicle based at least in part on each respective data indicative of an ambient sound level in the plurality; and determining a noise level associated with the autonomous vehicle based at least in part on the first data and the second data;

wherein the noise level associated with the autonomous vehicle comprises a noise level associated with a component used for an autonomous operation of the autonomous vehicle; and wherein for each ambient operating condition in the plurality, the component used for autonomous operation is either not installed in the autonomous vehicle or not powered on.

21. A method for determining a noise level associated with an autonomous vehicle, the autonomous vehicle comprising a passenger compartment configured to house one or more passengers, the method comprising:

positioning one or more microphones at one or more locations in the passenger compartment;

collecting first data indicative of a first sound level by the one or more microphones with the autonomous vehicle operating at a first operating condition;

implementing an operating condition change for the autonomous vehicle from the first operating condition to a second operating condition;

while the autonomous vehicle is operated at the second operating condition, collecting second data indicative of a second sound level by the one or more microphones; and determining a noise level associated with the autonomous vehicle based at least in part on the first data and the second data;

wherein the noise level associated with the autonomous vehicle comprises a noise level associated with a component used for an autonomous operation of the autonomous vehicle; and wherein implementing an operating condition change for the autonomous vehicle comprises either powering the component used for the autonomous operation on or powering the component used for the autonomous operation off.

22. A method for determining a noise level associated with an autonomous vehicle, the autonomous vehicle comprising a passenger compartment configured to house one or more passengers, the method comprising:

for each of a plurality of components used for autonomous operation of the autonomous vehicle:

positioning one or more microphones at one or more locations in the passenger compartment;

collecting first data indicative of a first sound level by the one or more microphones with the autonomous vehicle operating at a first operating condition;

implementing an operating condition change for the autonomous vehicle from the first operating condition to a second operating condition;

while the autonomous vehicle is operated at the second operating condition, collecting second data indicative of a second sound level by the one or more microphones; and determining a noise level associated with the respective component based at least in part on the first data and the second data; and selecting a component from the plurality of components for inclusion in the autonomous vehicle based at least in part on the respective noise level for each component.

* * * * *